(12) United States Patent
Ko et al.

(10) Patent No.: US 7,255,768 B2
(45) Date of Patent: Aug. 14, 2007

(54) ANODIC BONDING STRUCTURE, FABRICATING METHOD THEREOF, AND METHOD OF MANUFACTURING OPTICAL SCANNER USING THE SAME

(75) Inventors: Young-chul Ko, Kyungki-do (KR); Jin-ho Lee, Kyungki-do (KR); Chang-soo Lee, Kyungki-do (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 170 days.

(21) Appl. No.: 11/004,096

(22) Filed: Dec. 6, 2004

(65) Prior Publication Data

US 2005/0077633 A1    Apr. 14, 2005

Related U.S. Application Data

(62) Division of application No. 10/373,103, filed on Feb. 26, 2003, now abandoned.

(30) Foreign Application Priority Data

Feb. 27, 2002    (KR) ................. 2002-10469

(51) Int. Cl.
*B29C 65/00*    (2006.01)
(52) U.S. Cl. .................. 156/272.2; 156/273.1; 65/36; 438/455; 216/31; 216/33
(58) Field of Classification Search ............ 156/272.2; 204/155; 216/31, 33; 65/36; 438/455
See application file for complete search history.

(56) References Cited

U.S. PATENT DOCUMENTS 3,397,278 A    8/1968    Pomerantz (Continued)

FOREIGN PATENT DOCUMENTS

EP    1 026 728 A2    8/0000

(Continued)

OTHER PUBLICATIONS

European Search Report issued by the European Patent Office on Nov. 19, 2004 in corresponding application.

*Primary Examiner*—Shamim Ahmed
(74) *Attorney, Agent, or Firm*—Buchanan Ingersoll & Rooney PC

(57) ABSTRACT

Provided are an anodic bonding structure, a fabricating method thereof, and a method of manufacturing an optical scanner using the same. Provided anodic bonding structure having a substrate and a glass substrate arranged above the substrate, includes at least one dielectric and at least one metal layer deposited between the substrate and the glass substrate, with a dielectric arranged uppermost, wherein the uppermost dielectric and the glass substrate are anodic bonded. Provided method of fabricating an anodic bonding structure having a substrate and a glass substrate arranged above the substrate, includes an act of depositing at least one dielectric and at least one metal layer between the substrate and the glass substrate, with dielectric arranged uppermost, and an act of anodic bonding the uppermost dielectric with the glass substrate. In the provided structure of depositing the metal layer and the dielectric between the substrate and the glass substrate, the dielectric and the glass substrate or the dielectric and the metal layer are anodic bonded so that a stable performance is attained to manufacture various micro-electromechanical systems (MEMS) devices.

10 Claims, 8 Drawing Sheets

U.S. PATENT DOCUMENTS

| | | |
|---|---|---|
| 4,632,871 A | 12/1986 | Karnezos et al. |
| 5,395,481 A | 3/1995 | McCarthy |
| 5,538,151 A | 7/1996 | Faure et al. |
| 5,629,790 A | 5/1997 | Neukermans et al. |
| 5,663,078 A | 9/1997 | McCarthy |
| 6,258,704 B1 * | 7/2001 | Turner ........................ 438/613 |
| 6,638,627 B2 | 10/2003 | Potter |
| 2001/0048784 A1 | 12/2001 | Behin et al. |
| 2002/0086456 A1 | 7/2002 | Cunningham et al. |

FOREIGN PATENT DOCUMENTS

| | | |
|---|---|---|
| EP | 0 883 189 A1 | 12/1998 |
| EP | 1 180 493 A2 | 2/2002 |
| EP | 1 180 493 A3 | 1/2003 |
| EP | 1 026 728 A3 | 4/2004 |

\* cited by examiner

United States Patent US 7,255,768 B2

ANODIC BONDING STRUCTURE, FABRICATING METHOD THEREOF, AND METHOD OF MANUFACTURING OPTICAL SCANNER USING THE SAME

This application is a divisional application of application Ser. No. 10/373,103, filed on Feb. 26, 2003, now abandoned, and claims the priority of Korean Patent Application No. 2002-10469, filed Feb. 27, 2002 in the Korean Intellectual Property Office, which is incorporated herein in its entirety by reference.

BACKGROUND OF THE INVENTION

1. Field of the Invention

The present invention relates to an anodic bonding structure, a fabricating method thereof, and a method of manufacturing an optical scanner using the same, and more particularly, to an anodic bonding structure of a dielectric and a glass substrate or a dielectric and a metal layer, a fabricating method thereof, and a method of manufacturing an optical scanner using the same.

2. Description of the Related Art

Anodic bonding is a technique of bonding a silicon substrate widely used in the fabrication of a micro sensor device and a glass substrate having a thermal expansion coefficient similar to that of a silicon substrate. Pyrex glass, i.e., Corning glass 7740, generally used in an anodic bonding process includes predetermined amounts of sodium (Na) and potassium (K) so that when the Pyrex glass is heated at a temperature of over 200° C., elements are charged and easily moved by a voltage. When a silicon substrate and a glass substrate are aligned and a voltage of over 600 V is applied to the substrates, movable charges move rapidly. Thus, strong dielectric charges occur on the interfaces of the silicon substrate and the glass substrate to bond the silicon substrate with the glass substrate. A plurality of microelectromechanical systems (MEMS) processes use an anodic bonding method that realizes a stable silicon structure.

FIG. 1 is a sectional view of a conventional anodic bonding structure. A conventional anodic bonding structure is formed of a substrate 13 placed on a base plate 11 and a glass substrate 15 installed above the substrate 13. When the structure is heated at the above-described temperature, and a cathode and an anode are connected to an upper portion of the glass substrate 15 and a lower portion of the base plate 11, respectively, to apply the above-described voltage, charged ions move between the substrate 13 and the glass substrate 15 to perform a strong anodic bonding.

An anodic bonding process may be used in a method of manufacturing an optical scanner. In a conventional method of manufacturing an optical scanner, only thin silicon substrates are used, thereby an automation process is difficult. Also, a torsion bar is driven in an unstable manner and is easily broken, and the yield is lowered. Although a silicon substrate and a glass substrates are bonded to obtain a stable device, it is impossible to obtain the perfect torsion bar. Therefore, a silicon on insulator (SOI) substrate has been used to stably realize a bonding structure; however, an electrical isolation problem within the SOI substrate occurs.

SUMMARY OF THE INVENTION

To solve the above-described problems, it is an objective of the present invention to provide an anodic bonding structure of a dielectric and a glass substrate or a dielectric and a metal layer, and an optical scanner stably operated by using the anodic bonding structure to electrically connect the upper and lower surfaces of a silicon on insulator (SOI) substrate.

To accomplish the objective of the present invention, an anodic bonding structure including a substrate and a glass substrate arranged above the substrate, includes at least one dielectric and at least one metal layer deposited between the substrate and the glass substrate, with a dielectric arranged uppermost, wherein the uppermost dielectric and the glass substrate are anodic bonded.

Here, it is preferable that metal layers and dielectrics are alternately arranged between the substrate and the glass substrate, wherein the uppermost dielectric anodic bonds with the glass substrate.

It is preferable that at least one metal layer includes a first metal layer and a second metal layer, and at least one dielectric includes a first dielectric and a second dielectric. Here, the first metal layer, the first dielectric, the second metal layer, and the second dielectric are alternately arranged between the substrate and the glass substrate, wherein the second dielectric anodic bonds with the glass substrate.

Furthermore, at least one dielectric includes a first dielectric and a second dielectric, and the first dielectric, the metal layer, and the second dielectric are alternately arranged between the substrate and the glass substrate, wherein the second dielectric anodic bonds with the glass substrate.

To accomplish the objective of the present invention, an anodic bonding structure including a substrate and a glass substrate arranged above the substrate, includes a dielectric formed under the glass substrate. Furthermore, at least one dielectric and at least one metal layer deposited between the substrate and the dielectric, with a metal layer arranged uppermost, wherein the dielectric formed under the glass substrate and the uppermost metal layer are anodic bonded.

Moreover, at least one metal layer includes a first metal layer and a second metal layer, and at least one dielectric includes a first dielectric and a second dielectric. The first metal layer, the first dielectric, the second metal layer, and the second dielectric formed under the glass substrate are alternately arranged between the substrate and the glass substrate, wherein the second metal layer and the second dielectric are anodic bonded.

It is preferable that the substrate is formed of silicon and the dielectric is formed of silicon oxide.

It is preferable that the metal layer includes a gold (Au) layer and a chrome (Cr) layer.

To accomplish the objective of the present invention, a method of fabricating an anodic bonding structure having a substrate and a glass substrate arranged above the substrate, includes an act of depositing at least one dielectric and at least one metal layer between the substrate and the glass substrate, with dielectric arranged uppermost, and an act of anodic bonding the uppermost dielectric with the glass substrate.

To accomplish the objective of the present invention, a method of fabricating an anodic bonding structure having a substrate and a glass substrate arranged above the substrate, includes an act of forming a dielectric under the glass substrate, an act of depositing at least one dielectric and at least one metal layer between the substrate and the dielectric, with a metal layer arranged uppermost, and an act of anodic bonding the uppermost metal layer with the dielectric under the glass substrate.

It is preferable that the act of anodic bonding further includes an act of heating at about 300 to 400° C. and applying a pressure of about 800 to 1200 N and a voltage of about 800 to 2000 V to the anodic bonding structure.

It is preferable that the substrate is formed of silicon and the dielectric is formed of silicon oxide.

It is preferable that the metal layer includes an Au layer and a Cr layer.

To accomplish the objective of the present invention, a method of manufacturing a top structure of an optical scanner including a rectangular frame, torsion bars extended from the frame and located with a separation region therebetween, a rectangular scanning mirror connected to the torsion bars and arranged at a central portion, and driving comb electrodes formed on the lower surface of the scanning mirror, the method includes an act of sequentially depositing a first substrate, a dielectric, and a second substrate, an act of performing a photolithography process on the upper surface of the second substrate to form the scanning mirror and a lower frame of the frame, an act of forming pin holes in the scanning mirror and the lower frame, and depositing a metal layer on the scanning mirror and the upper surface of the lower frame, an act of depositing a dielectric on the upper surface of the metal layer, and anodic bonding the dielectric on the upper surface of the lower frame with a glass substrate, an act of polishing the first substrate and patterning the upper surface of the frame which will be an upper frame to coat a metal layer on the upper surface of the upper frame, and an act of forming the upper frame and the torsion bars by etching the first substrate into a predetermined pattern for penetrating a portion corresponding to the separation region and forming the driving comb electrodes on the lower surface of the scanning mirror.

It is preferable that the act of anodic bonding further includes an act of heating at about 300 to 400° C. and applying a pressure of about 800 to 1200 N and a voltage of about 800 to 2000 V.

It is preferable that the first and second substrates are formed of silicon and the dielectric is formed of silicon oxide.

It is preferable that the metal layer includes an Au layer and a Cr layer.

The present invention provides an anodic bonding structure between a dielectric and a glass substrate and an anodic bonding structure between a dielectric and a metal layer to manufacture various devices using micro-electromechanical systems (MEMS) process. In addition, an optical scanner having stable performance is provided by using the MEMS process.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

FIGS. 2A through 2D are sectional views illustrating anodic bonding structures according to first through fourth embodiments of the present invention. In the anodic bonding structures according to the first through third embodiments of the present invention, a glass substrate and an uppermost dielectric in a stack structure of metal layers and dielectrics between a substrate and the glass substrate are anodic bonded.

Figure 1:
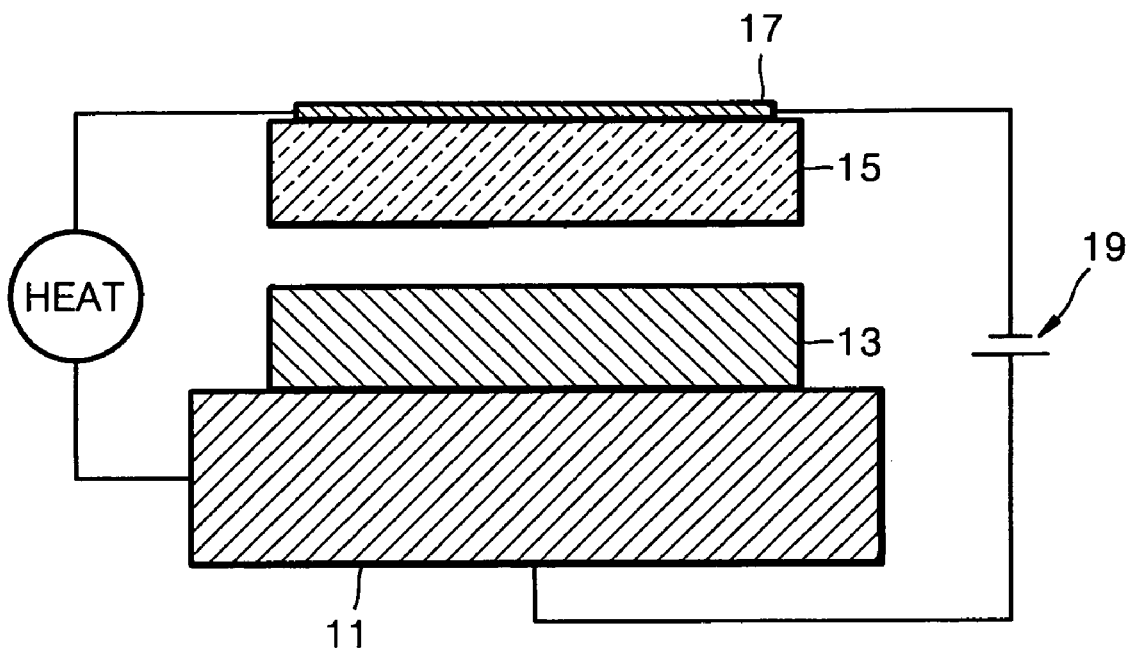
FIG. 1 is a sectional view illustrating a conventional anodic bonding structure.
Figure 2A:
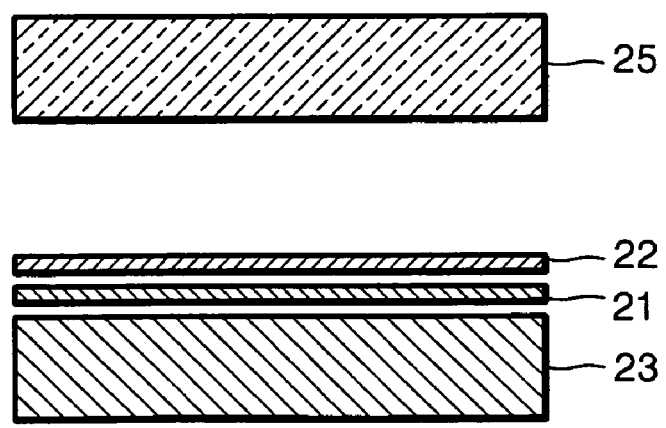
FIG. 2A is a sectional view illustrating an anodic bonding structure according to a first embodiment of the present invention.

With reference to FIG. 2A, a metal layer 21 is deposited on the upper surface of a substrate 23 and a dielectric 22 is formed on the upper surface of the metal layer 21. Here, the dielectric 22 and a glass substrate 25 are anodic bonded to form an anodic bonding structure according to a first embodiment of the present invention.

Figure 2B:
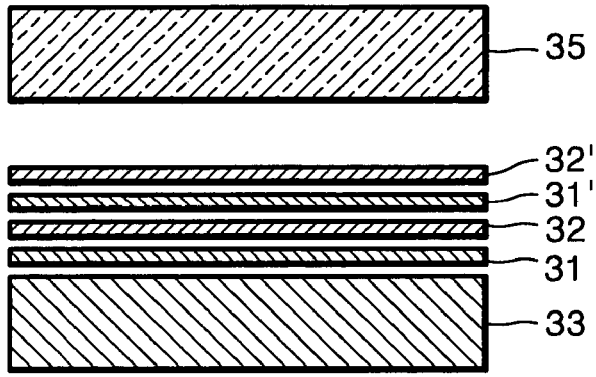
FIG. 2B is a sectional view illustrating an anodic bonding structure according to a second embodiment of the present invention.

With reference to FIG. 2B, a first metal layer 31 is deposited on the upper surface of a substrate 33 and a first dielectric 32 is formed on the upper surface of the first metal layer 31. Thereafter, a second metal layer 31' is deposited on the upper surface of the first dielectric 32 and a second dielectric 32' is formed on the upper surface of the second metal layer 31'. Here, the second dielectric 32' and a glass substrate 35 are anodic bonded to form an anodic bonding structure according to a second embodiment of the present invention.

Figure 2C:
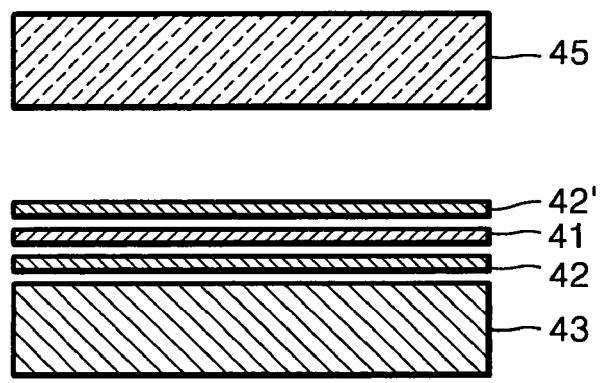
FIG. 2C is a sectional view illustrating an anodic bonding structure according to a third embodiment of the present invention.

With reference to FIG. 2C, a first dielectric 42 is formed on the upper surface of a substrate 43, a metal layer 41 is deposited on the upper surface of the first dielectric 42, and a second dielectric 42' is formed on the upper surface of the metal layer 41. Thus, an anodic bonding structure according to a third embodiment of the present invention is formed.

Unlike the anodic bonding structures according to the first through third embodiments of the present invention, a second dielectric is preformed under a glass substrate in an anodic bonding structure according to a fourth embodiment of the present invention. Thus, the second dielectric under the glass substrate and an uppermost metal layer in a stack structure of metal layers and dielectrics on the upper surface of a substrate are anodic bonded.

Figure 2D:
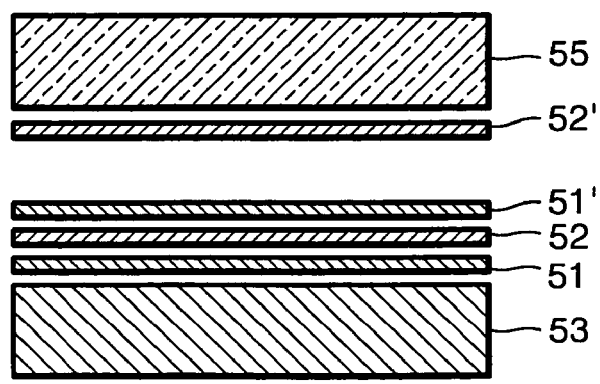
FIG. 2D is a sectional view illustrating an anodic bonding structure according to a fourth embodiment of the present invention.

With reference to FIG. 2D, a second dielectric 52' is preformed on the lower surface of a glass substrate 55. A first metal layer 51 is deposited on the upper surface of a substrate 53, a first dielectric 52 is formed on the upper surface of the first metal layer 51, and a second metal layer 51' is deposited on the upper surface of the first dielectric 52. Here, the second metal layer 51' and the second dielectric 52' are anodic bonded to form an anodic bonding structure according to a fourth embodiment of the present invention.

It is preferable that the anodic bonding processes take place at a temperature of about 300 to 400° C. and a pressure of about 800 to 1200 N and a voltage of about 800 to 2000 V is applied to the substrates during the processes.

Components of the anodic bonding structures according to the first through fourth embodiments of the present invention will now be described in detail.

Silicon substrates are generally used for the substrates 23, 33, 43, and 53; however, gallium (Ga) substrates, substrates of nitride group compound, or of arsenic (As) group compound may be used while substrates in which more than two materials are stacked can be used for the substrates 23, 33, 43, and 53.

Gold (Au), chrome (Cr), and any materials having metal properties can be used for the metal layers 21, 31, 31', 41, 51, and 51'. Here, the metal layers 21, 31, 31', 41, 51, and 51' are deposited by a physical deposition method, such as sputtering, or a chemical deposition method, such as chemical vapor deposition (CVD).

The dielectrics 22, 32, 32', 42, 42', 52, and 52' are formed of silicon oxide ($SiO_2$) or nitride group compound and formed by a chemical deposition method, such as CVD.

In the anodic bonding structures according to the first through third embodiments of the present invention, the dielectrics 22, 32', and 42' and the glass substrates 25, 35, and 45 are anodic bonded. In the anodic bonding structure according to the fourth embodiment of the present invention, the dielectric 52' and the metal layer 51' are anodic bonded.

In order to manufacture such an anodic bonding structure, appropriate numbers of the metal layers 21, 31, 31', 41, 51, and 51' and the dielectrics 22, 32, 32', 42, 42', 52, and 52' are sequentially deposited. Thereafter, the substrates 23, 33, 43, and 53 and the glass substrates 25, 35, 45, and 55 are heated at about 300 to 400° C. and a voltage of about 800 to 2000 V are applied to the substrates 23, 33, 43, and 53 and the glass substrates 25, 35, 45, and 55. As a result, the dielectrics 22, 32', and 42' and the glass substrates 25, 35, and 45 are anodic bonded or the dielectric 52' and the metal layer 51' are anodic bonded.

Figure 3A:
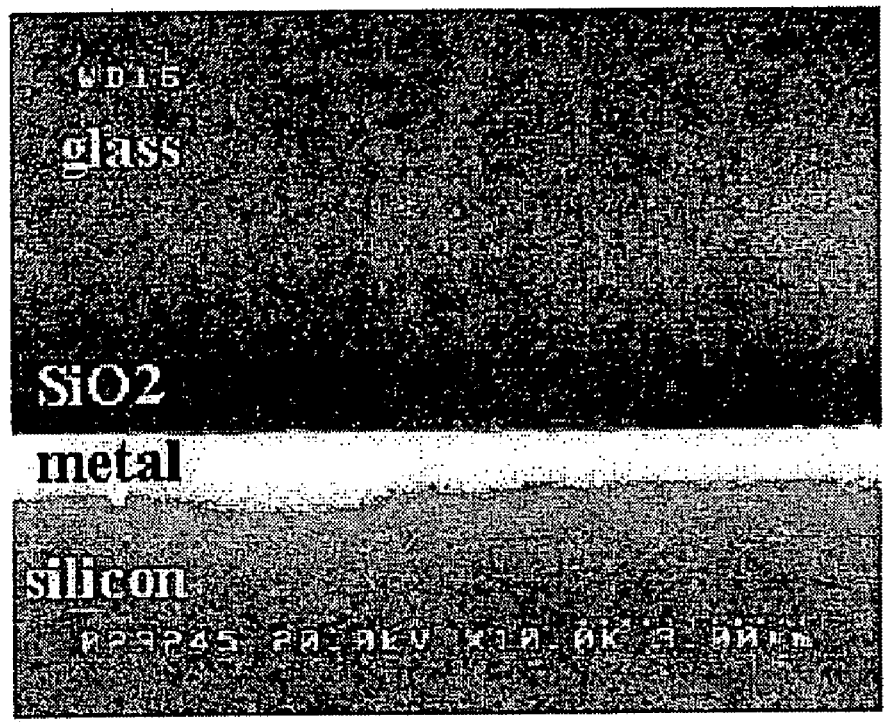
FIG. 3A is a scanning electron microscopy (SEM) photograph of an anodic bonding structure according to the first embodiment of the present invention.
Figure 3B:
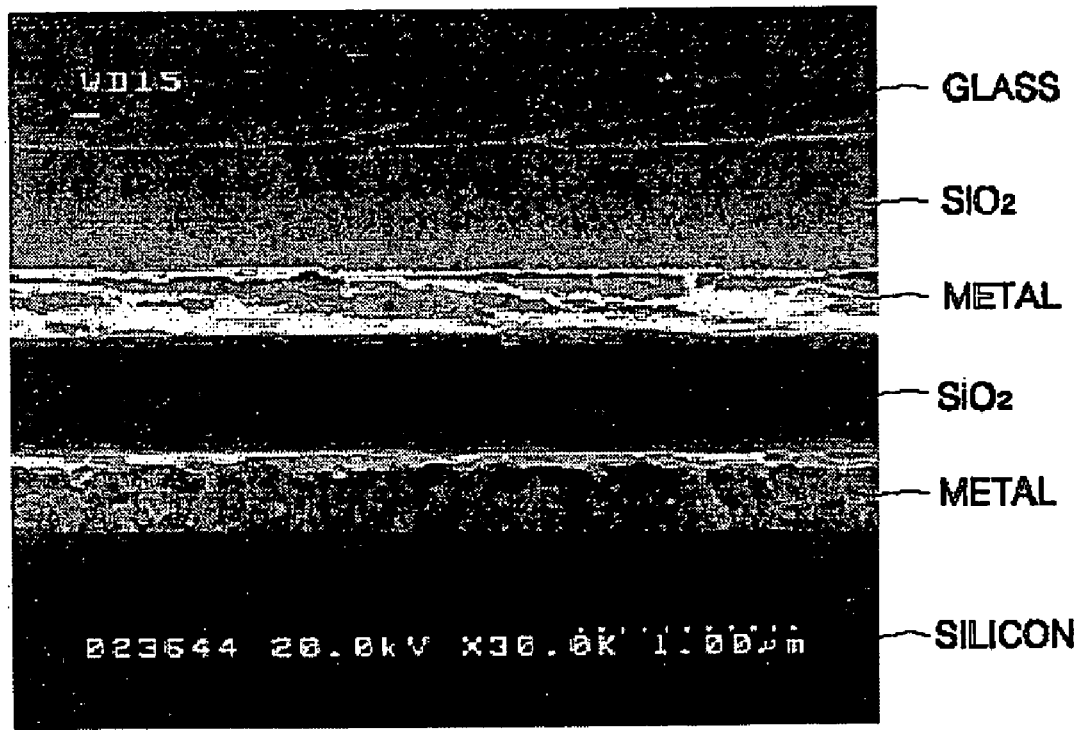
FIG. 3B is an SEM photograph of an anodic bonding structure according to the second embodiment of the present invention.

FIG. 3A is a scanning electron microscopy (SEM) photograph of an anodic bonding structure including a silicon substrate 23, a metal layer 21, a dielectric 22 of silicon oxide ($SiO_2$), and a glass substrate 25, according to the first embodiment of the present invention. FIG. 3B is an SEM photograph of an anodic bonding structure including a silicon substrate 33, a first metal layer 31, a first dielectric 32 of silicon oxide, a second metal layer 31', a second dielectric 32' of silicon oxide, and a glass substrate 35, according to the second embodiment of the present invention. The conditions for manufacturing such a structure are a temperature of about 400° C., a pressure of 1200 N, a cathode voltage of about −1500 V, and a bonding time of about 5 minutes.

Figure 4:
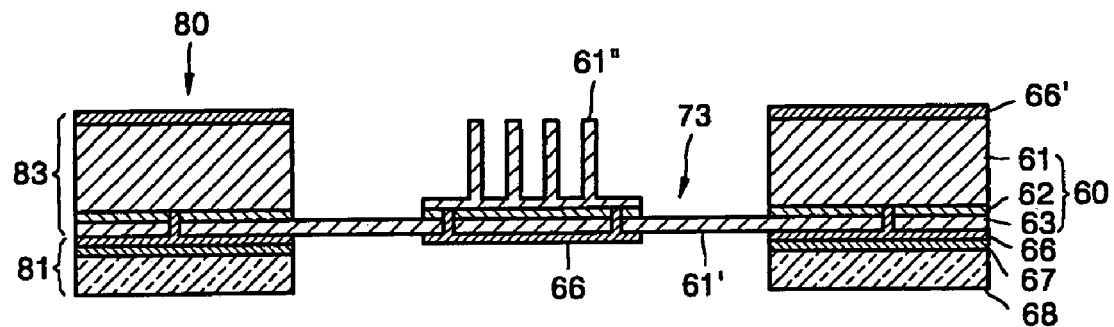
FIG. 4 is a sectional view illustrating the structure of an optical scanner manufactured by a method of manufacturing an optical scanner according to the present invention.
Figure 5:
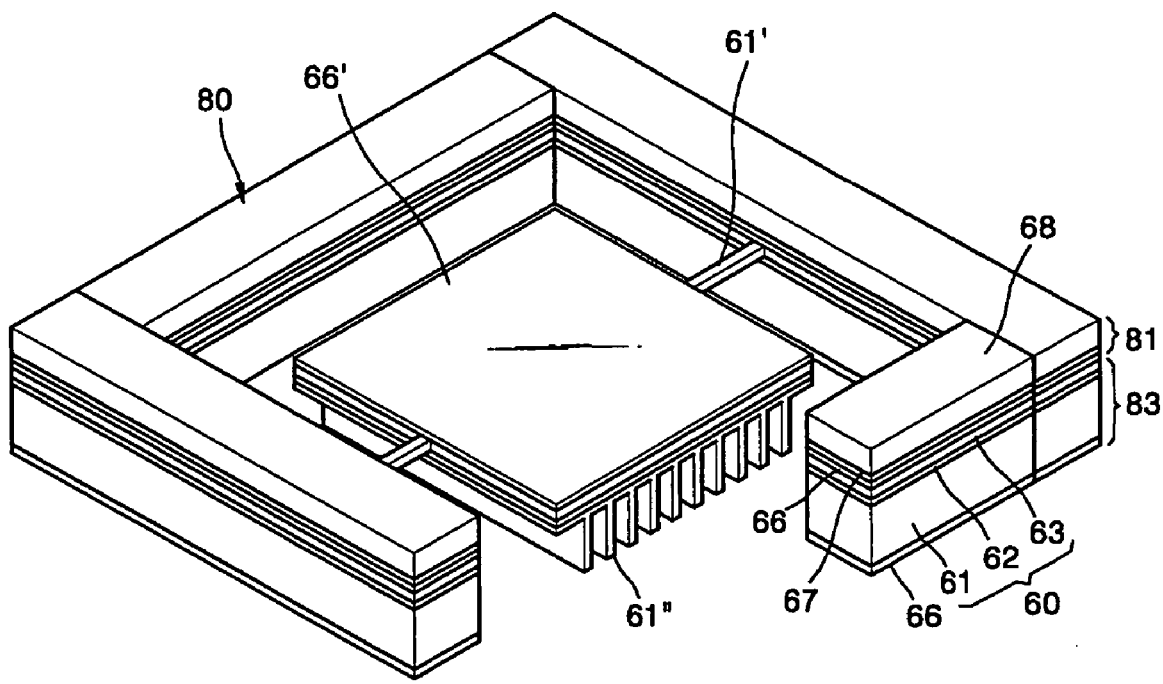
FIG. 5 is a perspective view illustrating an optical scanner manufactured by a method of manufacturing an optical scanner according to the present invention.

FIG. 4 is a sectional view illustrating the top structure of an optical scanner manufactured by the above-described anodic bonding structure and the fabricating method thereof, and FIG. 5 is a perspective view illustrating the optical scanner.

Referring to FIGS. 4 and 5, a top structure of an optical scanner manufactured by a method of manufacturing an optical scanner according to the present invention, includes a rectangular frame 80, torsion bars 61' extended from the frame 80 and located in the frame 80 with a separation region 73 therebetween, a rectangular scanning mirror 66" located at a central portion and connected to the torsion bars 61', and driving comb electrodes 61" formed under the scanning mirror 66".

The frame 80 is divided to an upper frame 81 and a lower frame 83. The upper frame 81 is formed of a glass substrate 68, a dielectric ($SiO_2$) 67 anodic bonded with the lower surface of the glass substrate 68, and a metal layer (Au and Cr) 66 located on the lower surface of the dielectric 67. Here, an anodic bonding structure in the frame 80 is the anodic bonding structure according to the first embodiment of the present invention.

It is preferable that the anodic bonding process takes place at a temperature of about 300 to 400° C. and a pressure of about 800 to 1200 N and a voltage of about 800 to 2000 V is applied to the anodic bonding structure during the process.

The lower frame 83 is formed of a first substrate (Si) 61, a metal layer (Au and Cr) 66' deposited under the first substrate 61, a dielectric ($SiO_2$) 62 located on the upper surface of the first substrate 61, and a second substrate (Si) 63 arranged on the upper surface of the dielectric 62 and extended to the torsion bars 61'.

Furthermore, the scanning mirror 66" is formed by depositing a metal layer (Au and Cr) 66 on the upper surface of the second substrate 63 to reflect light.

Pinholes are formed at a central portion of the frame 80 and two portions of the scanning mirror 66" to penetrate the second substrate 63, and the metal layer 66 is deposited into the pinholes. Thus, the first substrate 61, the second substrate 63, the torsion bar 61' and driving comb electrodes 61" are all electrically connected.

Moreover, the first substrate 61, the dielectric 62, and the second substrate 63 are formed in a silicon on insulator (SOI) wafer 60 structure. The SOI wafer 60 allows the scanning mirror 66" to stably drive, thereby improving the performance of the optical scanner.

A method of manufacturing an optical scanner according to the present invention will now be described with reference to drawings.

An upper structure of an optical scanner according to the present invention is formed by an anodic bonding structure according to the first embodiment of the present invention. Here, a metal layer 66 is deposited on a second substrate 63 formed of silicon, a dielectric 67 is formed on the upper surface of the metal layer 66, and the dielectric 67 and a glass substrate 68 are anodic bonded, in FIG. 6H.

FIGS. 6A through 6K are sectional views illustrating a method of manufacturing a top structure of an optical scanner according to the present invention.

Figure 6A:
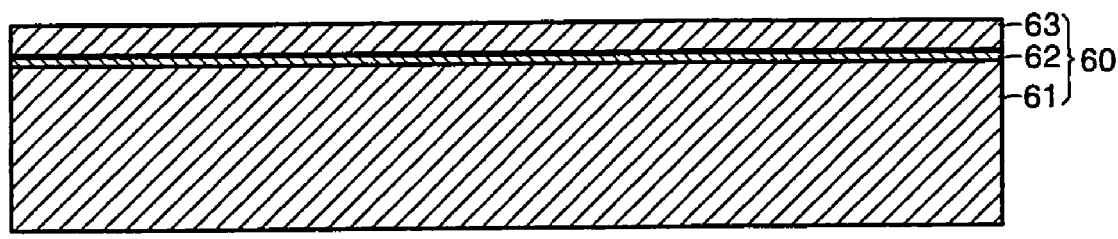
FIGS. 6A through 6K are sectional views illustrating a method of manufacturing an optical scanner according to the present invention.

Referring to FIG. 6A, a first substrate 61 formed of a silicon wafer having a thickness of about 500 μm is prepared and the surface of the first substrate 61 is oxidized to form a dielectric 62 formed of silicon oxide having a thickness of about 1 μm. Thereafter, a second substrate 63 formed of a silicon wafer having a thickness of about 15 μm is formed on the upper surface of the dielectric 62. Thus, an SOI wafer 60 is formed.

Figure 6B:
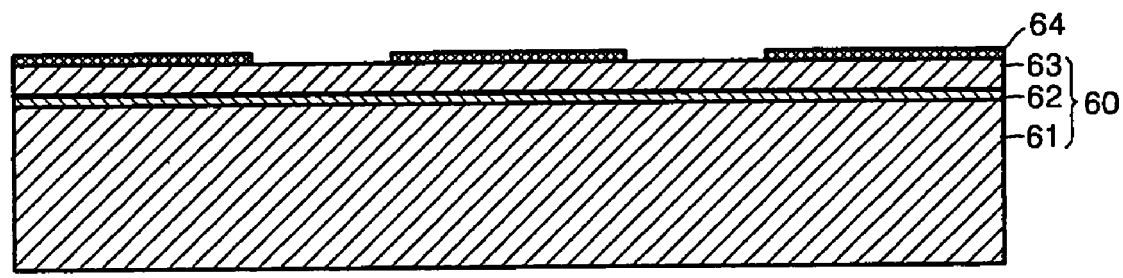

A photoresist layer 64, such as AZ7220, is coated on the upper surface of the SOI wafer 60, and then the photoresist layer 64 is exposed and developed by using a predetermined mask. Consequently, the SOI wafer 60 having a patterned photoresist layer 64 as shown in FIG. 6B is formed.

The second substrate 63 is etched by an inductively coupled plasma reactive ion etch (ICPRIE) process. The silicon oxide dielectric 62 formed under the second substrate 63 having a thickness of about 15 μm, stops the etch.

Figure 6C:
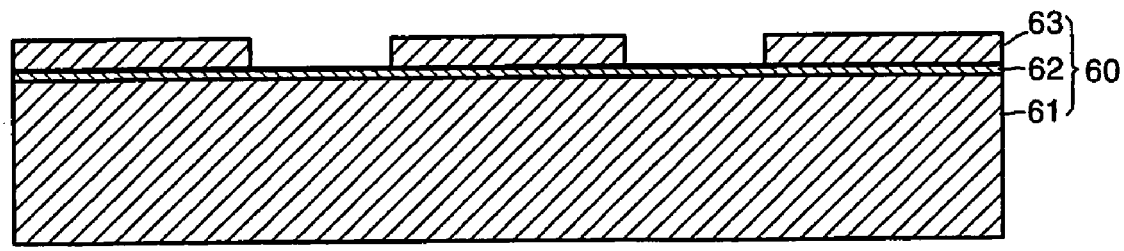

Therefore, the torsion bar 61' having a thickness of about 15 μm and a portion to be a scanning mirror 66" are formed as shown in FIG. 6C.

Figure 6D:
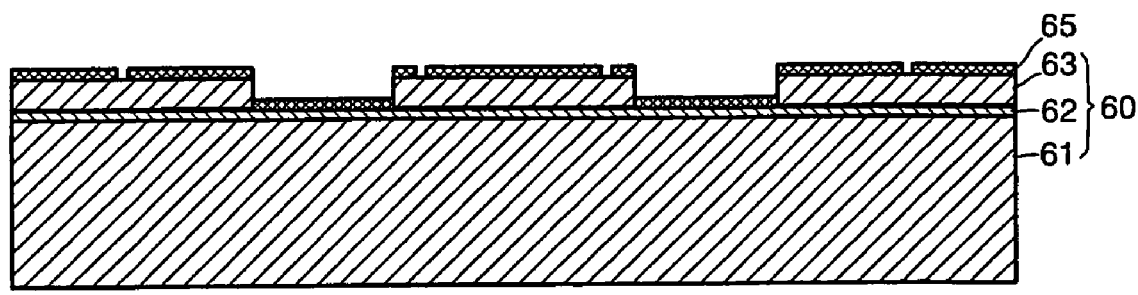
Figure 6E:
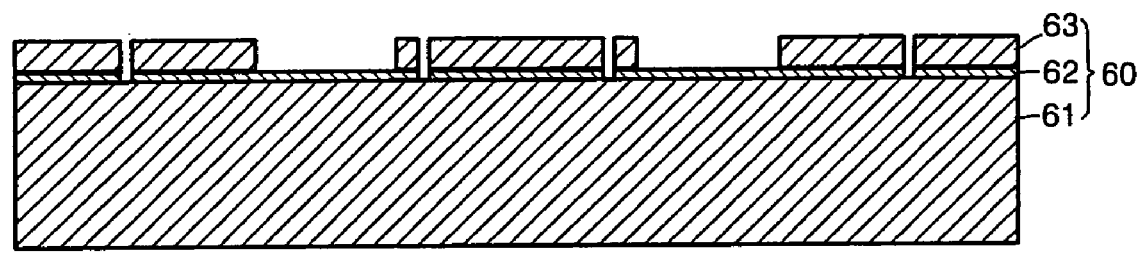

Referring to FIG. 6D, a photoresist layer 65 is coated again and photolithography process is performed on the photoresist layer 65 to form hole patterns. As shown in FIG. 6E, the second substrate 63 is etched by the ICPRIE process and the silicon oxide dielectric 62 is etched by a reactive ion etch (RIE) process.

Referring to FIG. 6E, a pinhole penetrates the central portion of the frame 80 to contact the surface of the first substrate 61. Furthermore, the pinholes are formed on left and right sides of the portion to be the scanning mirror 66" to penetrate to the first substrate 61.

Figure 6F:
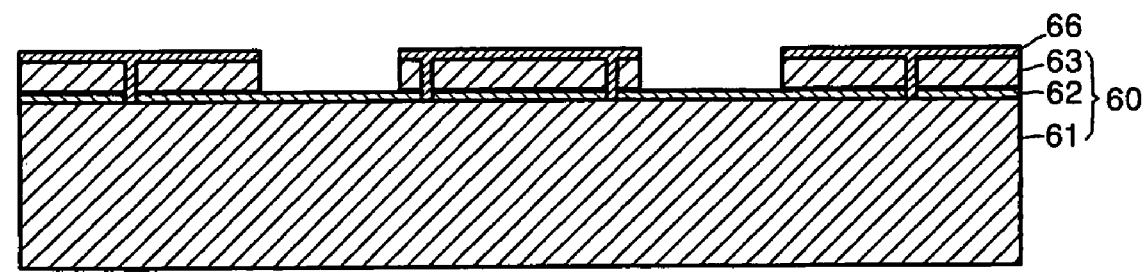

As shown in FIG. 6F, Cr to be used as an adhesion layer is deposited on the upper surfaces of the scanning mirror 66" portion and the frame 80 to a thickness of about 300 Å, and Au to be used as a reflection later is deposited on the Cr to a thickness of about 3000 Å so as to form a metal layer 66. Accordingly, the first substrate 61 and the second substrate 63 of the SOI wafer 60 are electrically connected.

Figure 6G:
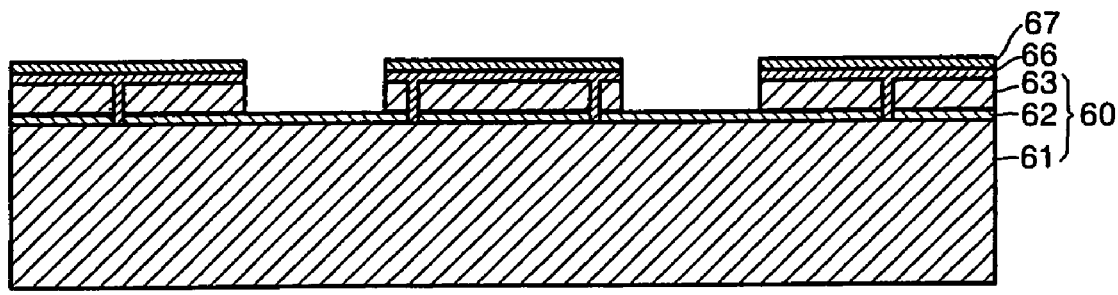
Figure 6H:
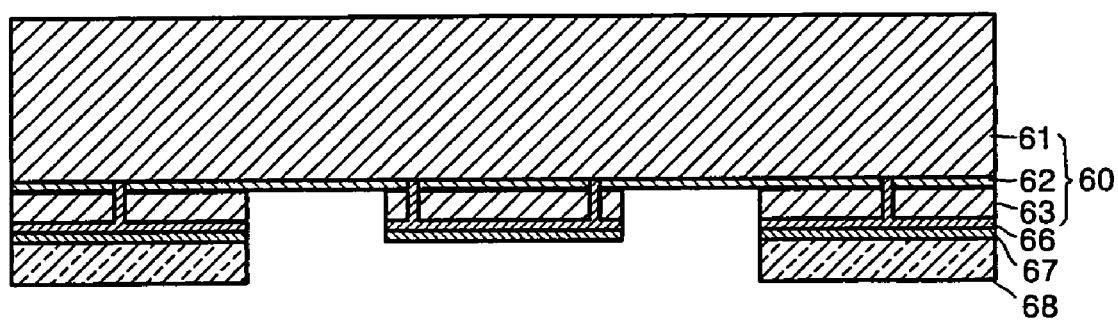

Referring to FIG. 6G, a silicon oxide dielectric 67 having a thickness of about 5000 Å is deposited by CVD and patterned on the upper surface of the metal layer 66 formed of Au and Cr. The structure is turned upside down, and then a glass substrate 68, for example, Pyrex glass, is anodic bonded with the silicon oxide dielectric 67, as shown in FIG. 6H.

Figure 6I:
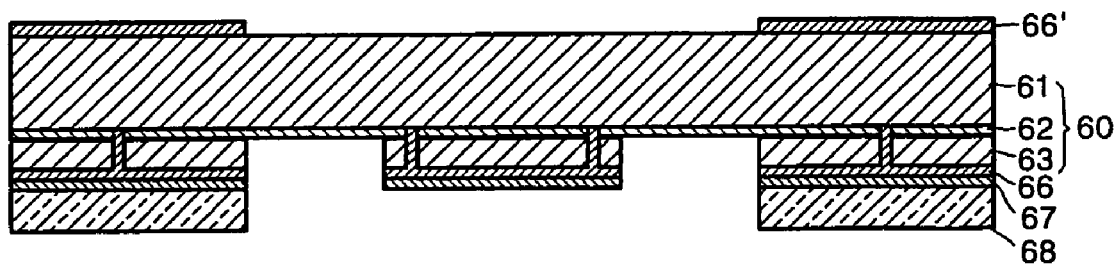

Referring to FIG. 6I, the silicon substrate 61 having a thickness of about 500 μm is polished to a thickness of about 100 μm by a chemical mechanical polishing (CMP) process. In addition, a metal layer (Au and Cr) 66' to be used as a fuse bonding layer to the lower structure is deposited and patterned.

Figure 6J:
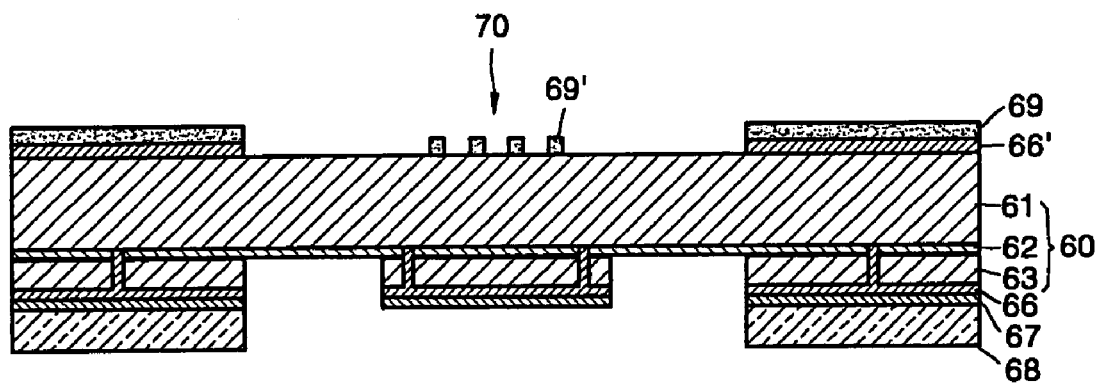

Referring to FIG. 6J, a photoresist layer 69, such as AZ4620, is coated on the structure and patterned by a conventional photolithography method. Thus, an upper photoresist pattern of comb structure 69' and metal layer 69 are formed as shown in FIG. 6J.

Figure 6K:
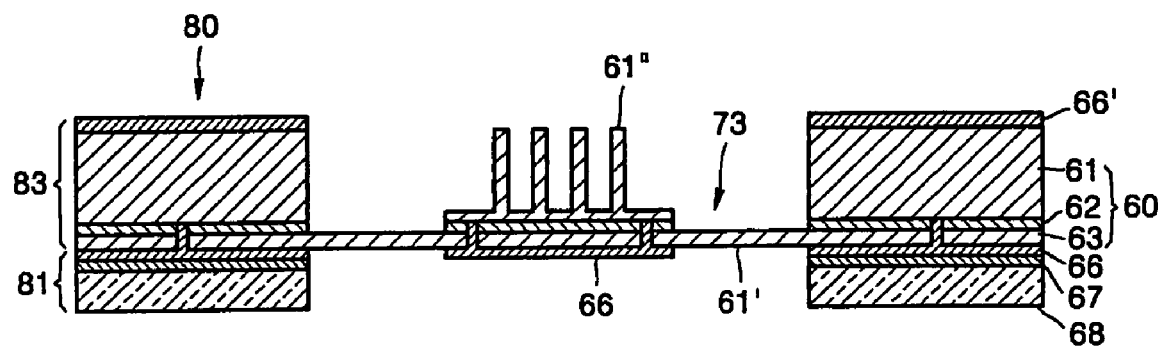

When the first substrate 61 is etched by the ICPRIE process, a separation region 73 between the frame 80 and the scanning mirror 66" is penetrated. Furthermore, the torsion bars 61' extended from the second substrate 63 are formed so that the structure as shown in FIG. 6K is completed.

Since an anodic bonding structure and a fabricating method thereof according to the present invention, anodic bonds a glass substrate with a dielectric or a dielectric with a metal layer, micro-electromechanical systems (MEMS) structures, such as condensers, cantilevers, sensors, and inductors of novel type, can be manufactured and eventually applied to a packaging process. In a method of manufacturing an upper structure of an optical scanner by using an anodic bonding structure and a fabricating method thereof, an optical scanner is stably manufactured and driven. As a result, the overall performance of the optical scanner can be improved.

It is noted that the present invention is not limited to the preferred embodiments described above, and it is apparent that variations and modifications by those skilled in the art can be effected within the spirit and scope of the present invention defined in the appended claims.

For example, those skilled in the art may realize various combinations of dielectrics and metal layers stacked between a substrate and a glass substrate. Accordingly, the scope of the present invention is not defined by the preferred embodiments; however, the scoped of the present invention will be defined by the appended claims.

As described above, an anodic bonding structure and a fabricating method thereof allow various combinations of dielectrics and metal layers stacked between a substrate and a glass substrate so that a novel device can be obtained.

What is claimed is:

1. A method of fabricating an anodic, bonding structure including a substrate, and a glass substrate arranged above the substrate, the method comprising:
    an act of depositing intermediate layers including at least one dielectric and at least metal layer between the substrate and the glass substrate, with dielectric arranged uppermost of the intermediate layers; and
    an act of anodic bonding the uppermost dielectric with the glass substrate.

2. A method of fabricating an anodic bonding structure including a substrate and a glass substrate arranged above the substrate, the method comprising:
    an act of forming a dielectric under the glass substrate;
    an act of depositing intermediate layers including at least one dielectric and at least one metal layer between the substrate and the dielectric, with a metal layer arranged uppermost of the intermediate layers; and
    an act of anodic bonding the uppermost metal layer with the dielectric under the glass substrate.

3. The method of claim 1, wherein the act of anodic bonding further includes an act of heating at about 300 to 400° C. and applying a pressure of about 800 to 1200 N and a voltage of about 800 to 2000 V to the anodic bonding structure.

4. The method of claim 2, wherein the act of anodic bonding further includes an act of heating at about 300 to 400° C. and applying a pressure of about 800 to 1200 N and a voltage of about 800 to 2000 V.

5. The method of claim 1, wherein the substrate is formed of silicon.

6. The method of claim 2, wherein the substrate is formed of silicon.

7. The method of claim 1, wherein the dielectric is formed of silicon oxide.

8. The method of claim 2, wherein the dielectric is formed of silicon oxide.

9. The method of claim 1, wherein the metal layer includes an Au layer and a Cr layer.

10. The method of claim 2, wherein the metal layer includes an Au layer and a Cr layer.

* * * * *